(12) United States Patent
Norrie (10) Patent No.: US 6,311,298 B1
(45) Date of Patent: Oct. 30, 2001

(54) MECHANISM TO SIMPLIFY BUILT-IN SELF TEST OF A CONTROL STORE UNIT

(75) Inventor: Christopher I. W. Norrie, San Jose, CA (US)

(73) Assignee: Rise Technology Company, Santa Clara, CA (US)

(*) Notice: Subject to any disclaimer, the term of this patent is extended or adjusted under 35 U.S.C. 154(b) by 0 days.

(21) Appl. No.: 09/251,788

(22) Filed: Feb. 17, 1999

(51) Int. Cl.$^7$ .......................... G11C 29/00; G06F 15/00; G06F 9/30

(52) U.S. Cl. .............. 714/718; 714/53; 714/54; 714/763; 714/805; 712/208

(58) Field of Search .................. 714/718, 41, 15, 714/53, 805, 763, 54; 712/208

(56) References Cited

U.S. PATENT DOCUMENTS

| | | |
|---|---|---|
| 4,019,033 | 4/1977 | Parmet ................................. 714/805 |
| 4,023,142 * | 5/1977 | Woessner ............................. 714/32 |
| 4,048,481 | 9/1977 | Bailey, Jr. et al. ..................... 714/41 |
| 4,511,967 | 4/1985 | Witalka et al. ......................... 710/1 |
| 4,574,351 * | 3/1986 | Dang et al. ........................... 710/68 |
| 5,056,015 | 10/1991 | Baldwin et al. ...................... 703/27 |
| 5,241,547 | 8/1993 | Kim ..................................... 714/53 |
| 5,386,549 | 1/1995 | Norrie et al. ......................... 714/15 |
| 5,408,674 | 4/1995 | Norrie et al. ....................... 712/208 |
| 5,557,558 * | 9/1996 | Daito ................................. 702/120 |
| 5,831,993 * | 11/1998 | Graef ................................. 714/727 |
| 6,003,142 * | 12/1999 | Mori .................................... 714/30 |

\* cited by examiner

Primary Examiner—Emmanuel L. Moise
(74) Attorney, Agent, or Firm—Oblon, Spivak, McClelland, Maier & Neustadt, P.C.

(57) ABSTRACT

A control store unit having a control store address generator able to provide both the normal control store address generation functions, and the BIST/logout address generation functions. In response to a test enable signal, the address generator switches between two modes: a normal mode and a test mode. Under the normal mode, normal control store addresses are generated. Under the test mode, a sequence of BIST/logout addresses are generated that sequentially cycles through the entire control store memory at full CPU speed.

35 Claims, 7 Drawing Sheets

MECHANISM TO SIMPLIFY BUILT-IN SELF TEST OF A CONTROL STORE UNIT

BACKGROUND OF THE INVENTION

This invention relates to the field of computer circuitry which microinstructions are stored in a control store unit.

In the modern microprocessor, it is common to use a wide control store memory, for example, such as that having a 1024 words where each word has over 200 bits control data. The control store memory normally holds and carries control store words to control various components inside the microprocessor. In general, the control store words can be addressed by a sequence of control store access addresses where each of the control store access addresses corresponds to the relevant control store word.

Conventionally, there are two methods of detecting defect (s) in the control store memory. The first method is to perform a built-in-self-test ("BIST") on the control store memory. The second method is to log each control store word out of the microprocessor so that each stored control store word can be verified. These two methods can be performed simultaneously, or sequentially, during the start-up of the microprocessor. In some cases, only one of these two mechanisms is employed in a microprocessor to detect any defects in the control store memory.

To perform the BIST on the control store memory, a BIST mechanism is provided in the microprocessor for generating a sequential control store address beginning from the first address of the control store memory and incrementing through the entire control store memory so that a BIST testing procedure can be performed on each control store word.

Similarly, a logout mechanism generates a sequence of sequential control store addresses so that each control store data can be read out bit-by-bit from the control store memory. Each bit of every control store word is then output from the microprocessor through a single pin so that all the control store data stored in the control store memory can be read out and compared with known patterns.

It should be mentioned that in some microprocessor designs, another form of memory logout is also implemented. Specifically, the microprocessor is provided with a memory address through a scan-in/scan-out pin located in the mircroprocessor. After a memory address is scanned in the microprocessor, the corresponding memory data is then scanned out from the specific memory bit-by-bit during each clock cycle using the scan-in/scan-out pin. Thus, any specific memory location within the microprocessor can be retrieved and compared off-chip.

Conventionally, the logout process can be performed using the same BIST mechanism because both processes require an address generator for generating a sequential control store address. For example, both the BIST and logout mechanism comprises an address generator for generating a sequence of control store addresses from the first address to the last address of the control store memory.

In the conventional designs, thus, dedicated hardware is needed to perform this BIST, or logging out function. And in most cases, the address generator for this dedicated BIST design cannot run at full CPU speed because of timing constraints. This handicap of not able to perform the BIST testing on the control store memory and/or logging out the control store memory at full speed creates problems of failing to detect some control store memory errors that only occur when the control store memory is under stress (i.e. running under full CPU speed).

Therefore, it is desirable to have a control store BIST and/or logout mechanism which can perform the logout at full CPU speed while being able to maintain a simple design without adding additional hardware to the control store design.

SUMMARY OF THE INVENTION

It is therefore an object of the present invention to provide a BIST and/or logout mechanism capable of detecting defects of the control store memory of a control store unit.

It is another object of the present invention to provide a control store unit capable of performing self-testing of all the control store words stored in the control store memory.

It is yet another object of the present invention to provide a control store unit capable of logging out all the control store words of the control store memory.

It is another object of the present invention to provide a control store address generator capable of operating in both a normal mode and a test mode with minimal addition of hardware.

It is yet another object of the present invention to provide a BIST/logout mechanism to test the control store memory at the full CPU speed.

The present invention discloses a control store unit having a novel control store address generator. According to the present invention, the control store address generator provides both the normal control store address generation function, and the BIST/logout address generation function. In response to a test enable signal, the address generator switches between two modes: a normal mode and a test mode. Under the normal mode, normal control store addresses are generated. Under the test mode, a sequence of BIST/logout addresses are generated. This sequence of BIST/logout address sequentially cycles through the entire control store memory at full CPU speed.

Additional objects, features and advantages of various aspects of the present invention will become apparent from the following description of its preferred embodiments, which description should be taken in conjunction with the accompanying drawings.

DETAILED DESCRIPTIONS OF THE DRAWINGS

Figure 1:
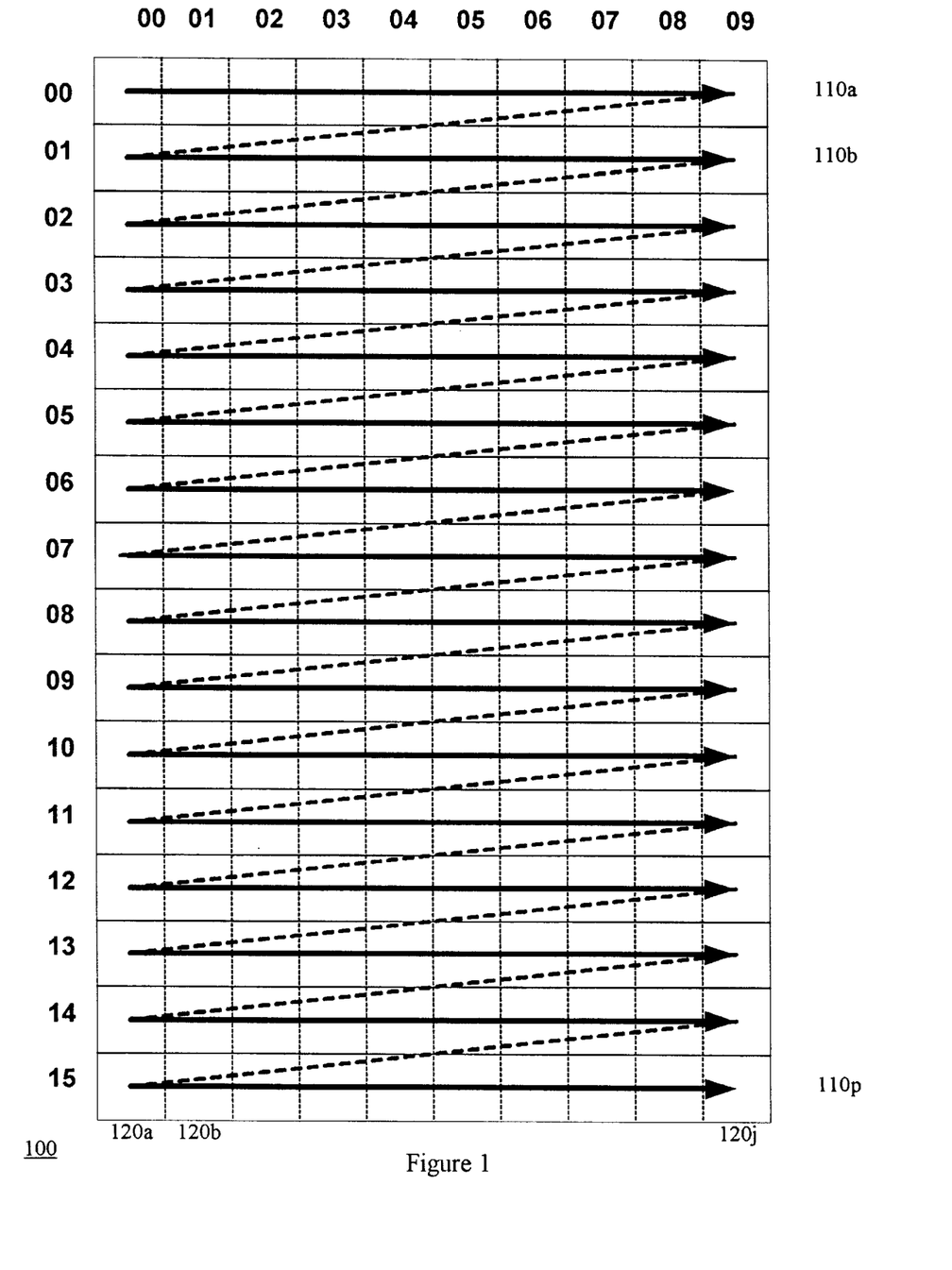
FIG. 1 shows a conventional method of logging out a control store memory.

FIG. 1 shows a conventional method of logging out a control store memory. The control store memory 100 as shown in FIG. 1 is located in a microprocessor having a control store logout mechanism (not shown) for generating a sequence of control store addresses for sequentially logging out the control store memory. As shown in the figure, the control store memory 100 in this example comprises 16 control store words numbered 00, 01 . . . 15 (i.e. 110a,b . . . p) wherein each control store word comprises 10 data bits numbered 00, 01 . . . 09 (i.e. 120a,b . . . j).

The conventional logout process begins by generating the first control store word 00 (i.e. 110a) address. The first control store word 110a is then read by the logout mechanism from the control store memory. As shown in FIG. 1, the first arrow shows that the first control store word 110a is then sequentially logged out bit-by-bit from the first data bit 00 (i.e. 120a) to the last data bit 09 (i.e. 120j). When the entire first control store word is logged out, the BIST/logout mechanism generates the next control store address (i.e. the second control store word 110b) and the second control store word 110b is logged out bit-by-bit (i.e. 120a,b . . . p) similarly. This process is then repeated until every bit in every control store word in the control store memory is logged out.

Figure 2:
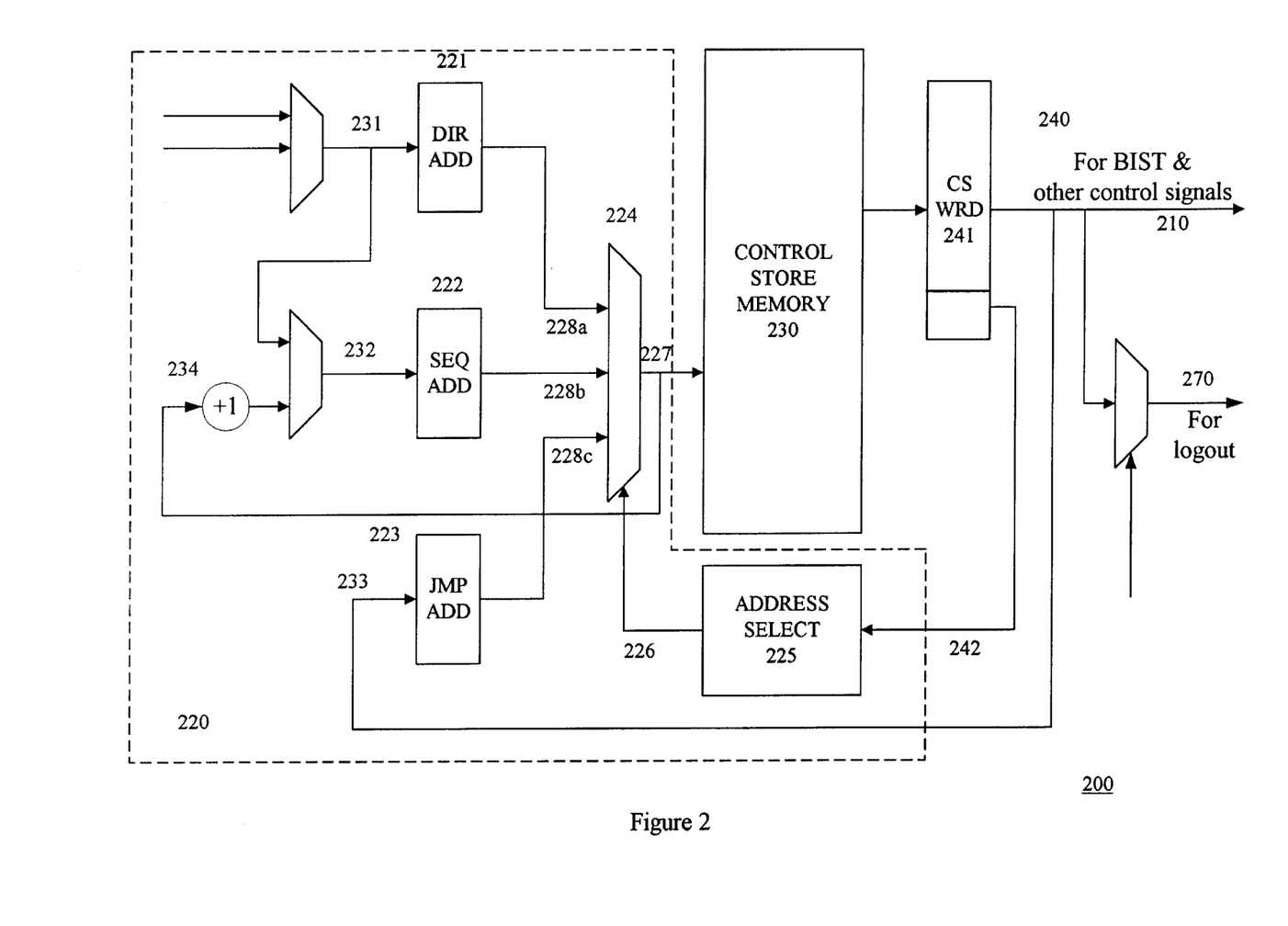
FIG. 2 shows a conventional control store unit for providing control signals to various components in a microprocessing system

FIG. 2 shows a conventional control store unit 200 for providing control signals 210 to various components in a microprocessing system. The control store unit 200 as shown comprises three parts, an address generator 220, a control store memory 230 for storing control data, and an output port 240 for outputting control signals to other components of the microprocessor.

In the control store unit as shown, the address generator 220 comprises five major components: a direct address provider 221, a sequential address provider 222, a jump address provider 223, an address multiplexer 224, and an address select circuit 225. In response to the select signals 226 provided by the address select circuit 225, the address multiplexer 224 selects a control store address 227 from one of the three address providers 228a,b,c as a control store access address for accessing one storage location of the control store memory 230.

Conventionally, the input of the direct address provider 221 is fed with a hashed instruction opcode, or a possibly other direct address such as an address for an exception point, etc, provided by an instruction queue (not shown). Normally, the hashed instruction opcode is used as a key to access one or more storage locations of the control store memory 230. Thus, the hashed instruction opcode, if selected, is treated as the control store access address to access one storage location of the control store memory 230.

The second component of the address generator is the sequential address provider 222. The sequential address provider 222 is used to provide a sequence of control store addresses 228b so that a block of the control store memory 230 can be accessed in a sequential order. For example, the sequential address generator 222 is selected when a block of control store words is needed to perform all required microinstructions for one instruction opcode. In this case, a block of storage locations in the control store memory 230 is required to be accessed sequentially. In the control store unit 200 as shown, the sequential address provider 222 comprises an address incrementor 234 for incrementally stepping through a block of the control store addresses beginning at a starting address so that all control store data within the control store block can be sequentially retrieved from consecutive control store locations. In general, the sequential address provider 222 will continue providing the sequential control store addresses until either (a) the ending address of the block of the control store data is reached for that instruction opcode, or (2) a jump instruction is encountered so that the sequential access of the control store memory is no longer required.

In the system as shown, the third component of the address generator is the jump address provider 223. As shown in the figure, the jump address provider 223 is provided with a next control store address 233 extracted from the current control store word 241 read out from the control store memory 230. Generally, the next control store address 223 is a section of the current control store word 241. The next control store address 223, for example, can be a jump address from a conditional/unconditional jump control store instruction.

In some other designs, the address generator further comprises a subroutine return address generator (not shown) for providing the control store memory 230 with a subroutine return address. The subroutine address is normally an incremented address of the original subroutine calling address. However, the detail operation of the subroutine return address generator is not within the scope of the present invention.

As described in the previous paragraphs, the address generator 220 comprises an address multiplexer 224 for selecting a control store access address from the three address providers 221,222,223. In response to a set of address selection signals 226 provided by an address select logic 225, the address multiplexer 224 selects the appropriate control store access address from one of the three address providers 221,222,223.

Furthermore, as shown in the figure, the address select logic 225 is coupled with the current control store word 241 read from the control store memory 230. The current control store word 241 provides a set of next address controlling information 242 to the address select logic 225. In addition, a group of status information (not shown) is also provided to the address select logic 225 from other components of the microprocessor. In response to the next address controlling information 242 and the status signals, the address select logic 225 generates the address selection signals 226 to control the address multiplexer 224 so that the appropriate control store address is selected from the three address providers 221,222,223 as the control store access address 227. The address selection operation, for example, depends on whether the current control store access is in the middle of a sequential control store access, or whether a jump (conditional or unconditional) access is indicated in the current control store word, or whether a new address is needed from the instruction queue. The details of the address select operation will be discussed in the following paragraphs.

As shown in the figure, the address multiplexer 224 selects an appropriate control store address path from one of the three address providers 221,222,223 to provide the control store memory 230 with the control store access address 227. Using the control store access address 227, the corresponding control store word in the control store memory 230 is then output as the current control store word 241. The current control store word 241 can be stored in a register for outputting to other components of the microprocessor (as shown in FIG. 2), or is simply output to various components within the microprocessor without being latched in any output register.

As it will be described in detail in the following paragraphs, it should be noted that the current control store word 241 comprises multiple sections. For example, one section of the current control store word 241 is provided to the address select circuit 225 for its decision making. One section of the current control store word 241 is provided as the next control store address to the next address provider 223. And, finally, a major section 210 of the current control store word 241 is provided to various components in the microprocessor.

In order to perform the BIST and/or the logout process of the control store memory 230 as discussed with FIG. 1, a control store BIST/logout mechanism (not shown) is needed in addition to the address generator 220 as shown in FIG. 2. Usually, the control store BIST/logout mechanism is an "added-on" component with the address generator as shown. Because of this "add-on" nature, the control store BIST/logout mechanism usually cannot perform the BIST and/or logout function at full CPU speed because of timing constraints. However, some control store memory errors such as data dependency problems and timing problems can only be detected by accessing the control store memory in the full CPU speed. Therefore, the conventional system is not satisfactory in discovering all the control store memory problems.

Figure 3:
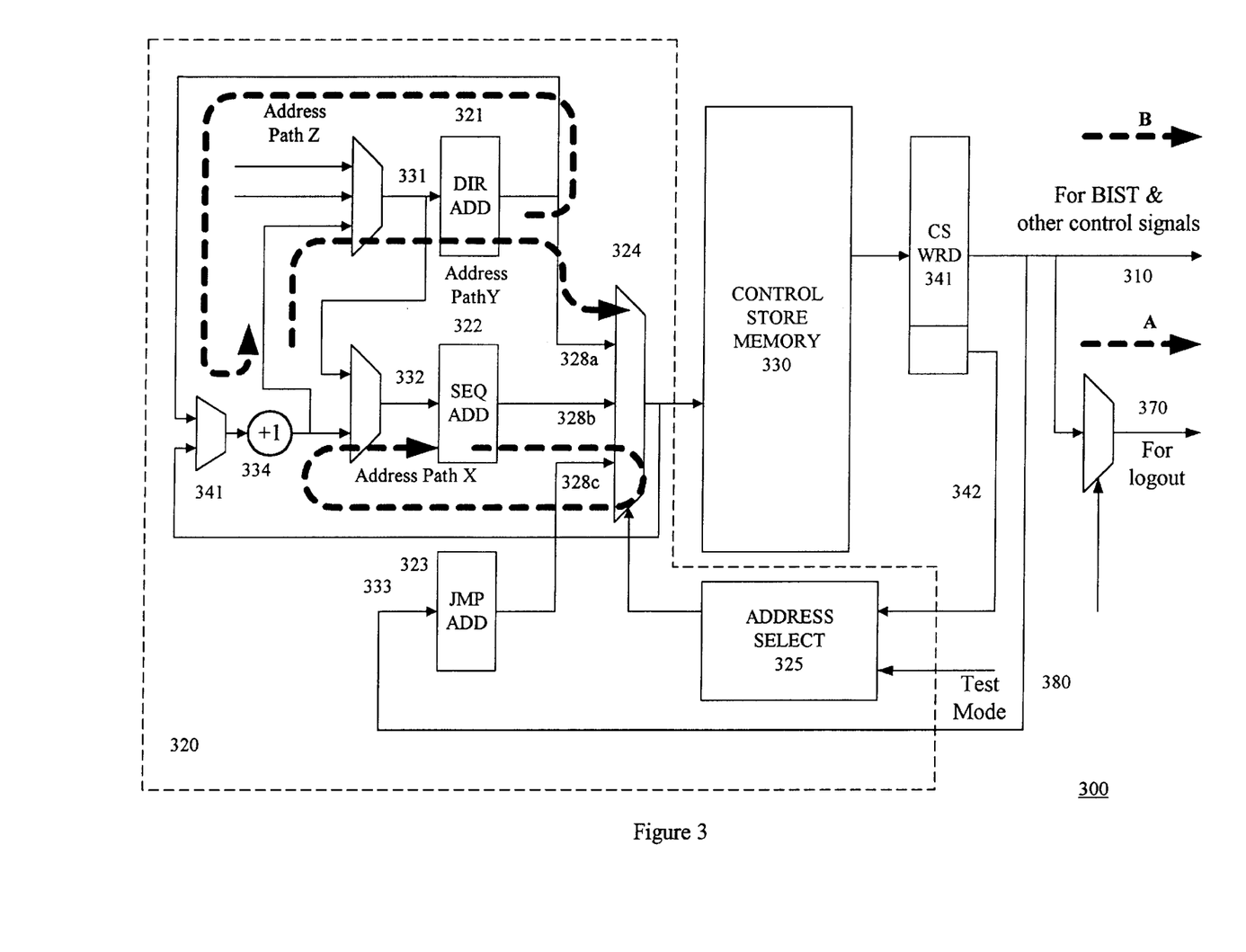
FIG. 3 shows a preferred embodiment of a control store unit according to the present invention.

FIG. 3 shows a preferred embodiment of a control store unit 300 according to the present invention. As it can be easily seen, this preferred embodiment of the control store unit 300 shares significant portion of the components with the conventional control store unit 200 as shown in FIG. 2. As with the control store unit 200 as shown in FIG. 2, the control store unit 300 according to the present invention comprises a control store address generator 320 for preforming normal control store addressing functions. However, in addition, the address generator 320 according to the present invention also generates a sequence of BIST/logout testing addresses for sequentially cycling through all storage locations of the control store memory 330 using some shared components from the conventional control store unit 200 as shown in FIG. 2. Particularly, according to this aspect of the present invention, the control store address incrementor 334 of the sequential address provider 322 is used for both the normal address generation and the BIST/logout testing.

In other words, according to the present invention, the control store address generator 320 of the present invention is able to switch between two modes in response to a test enable signal 380: The first mode is a normal mode for generating the control store access addresses in respond to hashed instruction opcodes provided. The second mode is a test mode for generating a sequence of sequential control store addresses beginning at the first control store address and incremented to the last control store address. Since the BIST/logout address generator shares components with the normal address generator 332, the BIST/logout circuit according to the present invention is able to logout the control store memory 330 at full CPU speed with minimal hardware modifications to the conventional control store unit.

In the preferred embodiment of the present invention as shown in FIG. 3, the test enable signal 380 is provided to the control store unit 300 for switching the control store unit between the normal mode and the test mode. When the normal mode is selected, the control store unit 300 according to the present invention performs the normal control store signals generating function similar to the control store unit 200 as shown in FIG. 2.

When the test mode is activated by the test enable signal 380, the address generator 320 of the control store unit generates a sequence of sequential addresses for performing the BIST testing and/or logging out the control store memory 330 beginning at the first control store address. The address incrementor 334 increments the control store access address in a sequential order responding to each CPU clock cycle. Then the sequence of control store access addresses is provided to the control store memory 330 so that the corresponding control store words can be accessed. The control store access addresses generated increments from the first control store address until the last control store address of the control store memory without interruption. Thus, in the test mode, the control store unit 300 of this preferred embodiment generates the sequence of sequential control store address for performing the BIST function and/or logging out the control store memory without the need of a separate BIST/logout mechanism as required by the conventional system.

Particularly, in the present invention, the BIST/logout address generating portion of the control store unit 300 shares most of the components with the normal control store address generator 220 as described with FIG. 2. By sharing most of the address generator components, the BIST/logout process can be performed at full CPU speed while having minimal hardware additions to the conventional system.

In addition, FIG. 3 shows another aspect of the present invention. This aspect of the invention relates to the use of different address paths in the control store unit during normal operation and the BIST/logout process. As shown in FIG. 3, three separate address paths are highlighted as path X, path Y, and path Z. Specifically, path X shows a control store address path for incrementing the control store address during the generation of sequential address in normal operation. On the other hand, path Y shows a control store address path for providing the sequence of sequential addresses to the control store memory during the BIST/logout process. Finally, path Z shows a control store address path for incrementing the control store address during the BIST/logout process.

As described in the previous paragraph, address path X as shown indicates how the sequence of control store addresses is generated during the normal address generation operation (i.e. non-BIST/logout testing). When a sequence of sequential control store addresses is needed, the sequential address provider 322 will be selected. As discussed in previous paragraphs, the sequence of the control store addresses is generated by the incrementor 334 and fed into the multiplexer 324 through the sequential address provider 322. As shown in path X, each of the control store access addresses is then fed back to the incrementor 334 for incrementation in preparing for next clock cycle.

During the BIST/logout testing, address path Y is selected for providing the sequence of sequential address to the control store memory 330. Instead of providing the control store address through the sequential address provider 322 as in address path X, the sequence of BIST/logout control store addresses is provided to the control store memory 330 through the direct address provider 321. The address path Y is designed as shown in FIG. 3 because, in some cases, the control signals provided to the address multiplexer 324 for selecting the sequential address path are found to be taking the most time consuming path. In these cases, it is faster for the address select circuit to control the address multiplexer 324 to select the output from the direct address provider 321. By using address path Y to provide the control store memory 330 with the next control store test address, this aspect of the present invention provides a faster address path for the BIST/log out testing process. However, it should be noted that the present invention does not preclude the use of the sequential address provider 321 to provide the sequence of BIST/logout addresses to the control store memory 330. This can be done with some timing penalties.

It should be noted that, according to this aspect of the present invention, during the BIST/logout testing, the control store address is still incremented by the incrementor 334 located in the sequential address provider 322. However, as indicated in address path Y, the incremented control store address generated by the incrementor 334 is provided to the direct address provider 321 to be provided to the address multiplexer 324.

Path Z is used for incrementing the control store address during the BIST/logout testing. Under this aspect of the present invention, the control store address is provided to the incrementor from the direct address provider for incrementation. As described in the previous paragraphs, timing delay is reduced by using the direct address provider (i.e. address paths Y and Z) for the BIST/logout testing instead of using the sequential address provider (i.e. address path X).

However, this invention is not limited to this embodiment because in some designs the sequential address provider address path (i.e. path X) might be able to provide a faster address path. Therefore, in another embodiment of the present invention (not shown), the sequence of the control store addresses is provided directly from the sequential address provider 322 to the control store memory 330 through the address multiplexer 324. In this embodiment, the address multiplexer 324 is controlled to select the output from the sequential address provider 322 as the control store access address during the BIST/logout process. This embodiment provides minimal changes to the conventional address generator while being able to provide the control store access address to the control memory 330 for the BIST/logout function.

Furthermore, in the preferred embodiment as shown in FIG. 3, the incrementor 324 as shown performs only a "+1" function. However, the present invention is not limited to only incrementing the control store address by one in each cycle. Any other incrementation offsets such as "+2", "+4" etc. can be used depending on the memory alignment of the control store memory 330.

It should be pointed out again, under the test mode, the sequential address generation of the present invention is performed by the address incrementor 334 already built in the control store unit 300. The same address incrementor 324 used in handling the normal sequential control store addresses is used in the present invention as the address incrementor for the BIST/logout testing. Because of the use of the same address incrementor 324 that is already located in the control store unit, the BIST/logout address generation in this test mode can be run at the full CPU speed. In addition, because of the sharing of the hardware components under these two modes, the present invention requires minimum hardware modifications to the conventional system in order to provide the BIST/logout testing of the control store memory.

Figure 4:
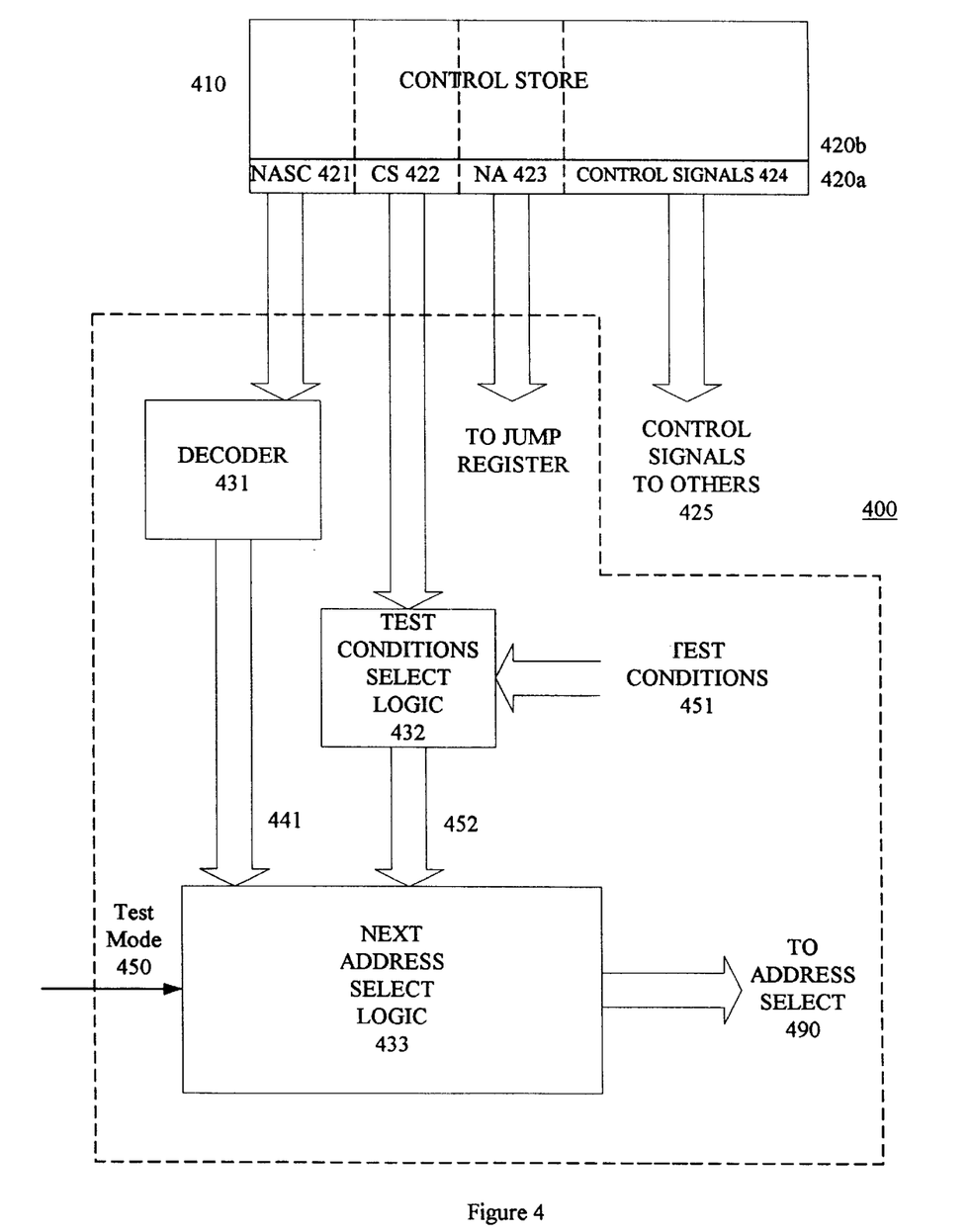
FIG. 4 shows the details of one embodiment of the address select circuit as used in the embodiment as shown in FIGS. 1 and 2.

FIG. 4 shows the details of one embodiment of the address select circuit 400 as used in the embodiment as shown in FIG. 3. It should be noted that the design of the address select circuit 400 is not limited to this embodiment. Depending on the contents of the control store words stored in the control store memory, the address select circuit 400 may be designed differently. In addition, the overall microprocessor design also affects the detail construction of the address select circuit 400.

As shown in the figure, for example, each control store word 420a of the control store memory 410 comprises different sections: Next Address Select Control section ("NASC") 421, Condition Select selection ("CS") 422, Next Address section ("NA") 423, and control signals section 424 for providing control signals 425 to other components in the microprocessor.

In the preferred embodiment as shown, the NASC field 421 controls the selection of the next address from a number of different sources, depending upon which operation sequence is to be performed. The NA field 423 represents the next control store address. Specifically, when an "unconditional" branch operation is being processed, the next instruction address is provided by the NA field 423. On the other hand, when a "conditional" branch operation is being processed, the next address is selected between the NA field 423 and the sequential address provided by the sequential address provider 322 in response to the test conditions provided under control of the CS field 422.

Furthermore, in another embodiment, this address select logic 300 can be modified to implement multi-way branching for conditional/unconditional branch operations. However, the details of this implementation are not within the scope of the present invention.

In the preferred embodiment as shown in FIG. 4, the NASC field 421 is provided to a decoder 431. Using the information supplied by the NASC field 431, the decoder 431 generates a set of the next address select control signals 441. Specifically, the decoder 431, in response to the NASC input 421, defines the type of sequencing to be carried out by the next address select logic 433. As shown in the figure, the test conditions select logic is fed with the CS field 422 and a plurality of test conditions input 451 from other components of the microprocessor. Using the information provided by the CS field 422, the test conditions select logic 432 selects the appropriate test condition 452 to be provided the next address select logic 433. Finally, in response to the inputs 441 from the decoder 432, the next address select logic circuit 433 generates the address selection signals 490 for the address multiplexer (not shown).

Particularly, under the test mode, the next address select logic 433 generates a set of control signals 490 to control the address multiplexer and other components of the control store unit as shown in FIG. 3. First, a portion of the control signals is provided to the address multiplexer to select the control store address from the direct address providers (i.e. address path Y) so that an incremented control store address is provided to the control store memory. Second, another portion of the control signals is provided to the address incrementor 341 multiplexer for selecting the control store address from the direct address provider 321 for incrementation again (i.e. address path Z).

Figure 5:
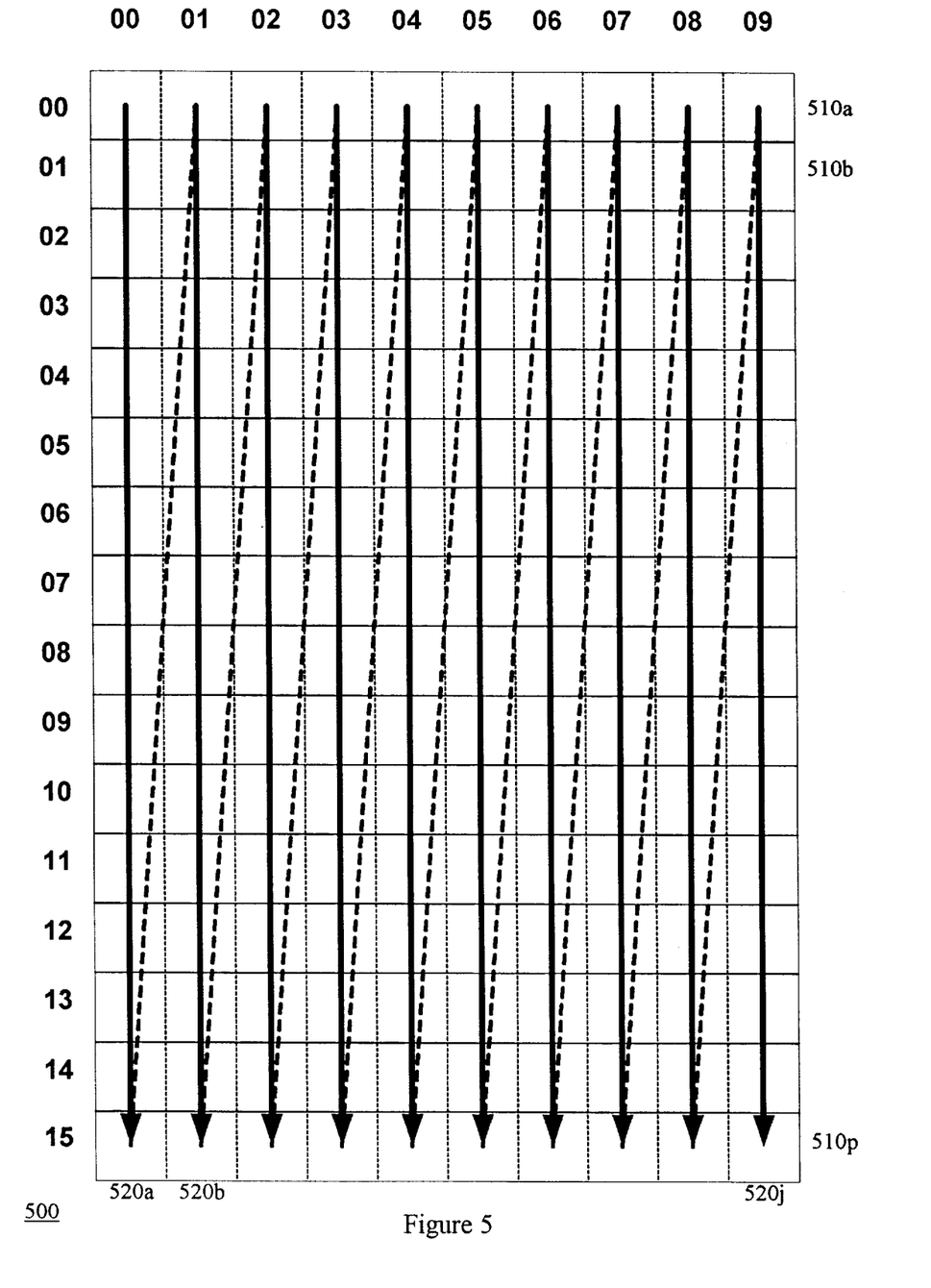
FIG. 5 shows a preferred method of logging out a control store memory according one aspect of the present invention.

Another aspect of the present invention is a novel way of logging out the control store memory. FIG. 5 shows a control store memory 500 similar to the one as shown in FIG. 1. The arrows as shown in FIG. 5 indicate the sequence of the logout process of the control store memory according to this aspect of the present invention. Comparing FIG. 5 to FIG. 1, it can be seen that the present logout method sequentially logouts the databits from the corresponding bit location of each control store word. After all the corresponding bits of every control store word (e.g. bit 520a of every control store word) in the control store memory are logged out, the logout process continues with the next bit of every control store word (e.g. bit 520b of every control store word). The logout process is completed when the last bits of all the control store words (e.g. bit 520j of every control store word) are logged out.

Specifically, as shown in FIG. 5, the logout process begins with logging out the first bit 00 (i.e. 520a) of each of the control store words (i.e. 510a,b . . . p). According to this aspect of the invention, the first bit 00 (i.e. 520a) of each control store word (i.e. 510a,b . . . p) is then logged out sequentially from the first control store word 00 (i.e. 510a) to the last control store word 15 (i.e. 510p) of the control store memory 500. After the first bit 00 (i.e. 520a) of the last control store word 15 (i.e. 510p) is logged out, the second bit 01 (i.e. 520b) of all control store words (i.e. 510a,b . . . p) are then logged out sequentially. The logout process will then terminate with the tenth bit 09 (i.e. 520j) of the sixteenth control store word 15 (i.e. 510p) is logged out.

It should be noted that, by cycling through all the control store words according to this aspect of the present invention as shown in FIG. 5, more control store errors such as data dependency errors can be detected. However, it should be pointed out the above-mentioned logout process is only one aspect of the present invention. Other aspects of the present invention can still be implemented without this specific method of logging out.

It should be noted that in the logout method as shown in either FIG. 1 or FIG. 5, only one bit of control store data is scanned out from the control store memory in each cycle. One of the reasons of only scanning out one bit of the storage at a time is to reduce the pinout required to log out the control store memory. Thus, in the control store unit as described, only one scan-out pin is needed because only one bit of the control data is read out from the control store memory during each cycle. In addition, another reason of only scanning out only one bit of data in each cycle is to detect data dependancy defects in the control store memory.

Another feature of the present invention is the ability to simultaneously perform the BIST and logout during the test mode. According to this aspect of the present invention, the BIST testing is simultaneously performed during the first cycle of the log out process (i.e. logging out the first bit "00" of every control store word). When the first bit 00 (i.e 520a) of every control store word is being logged out, the entire corresponding control store word is simultaneously provided to a BIST testing mechanism to perform the BIST testing. As shown in FIG. 3, a single bit of the selected control store word is provided for the logout process as indicated by arrow A, whereas the entire control store word is provided for the BIST testing through the address path as indicated by arrow B. In other words, during the first cycle of the logout process (i.e. logging out the first bit of every control store word), the corresponding control store word is provided for the BIST testing through the address path B. It should be noted that the BIST testing according to the present invention is not limited to be performed only during the first cycle of the logout process (i.e. bit "00"). Any other cycle in the logout process (e.g. logging out of bit "01", "02," . . . or "09") can also be used for simultaneously logging out the corresponding bit and performing the BIST testing. Furthermore, the BIST testing and the logout process can also be performed at different time instances, or sequentially.

It should be noted that since a major portion of the address generation task in the BIST/logout mechanism is performed by the same address incrementor of the sequential address generator used for the normal address generating functions, one of the advantages of the present invention is the ability to logout and/or perform the BIST function at full CPU speed.

Figure 6:
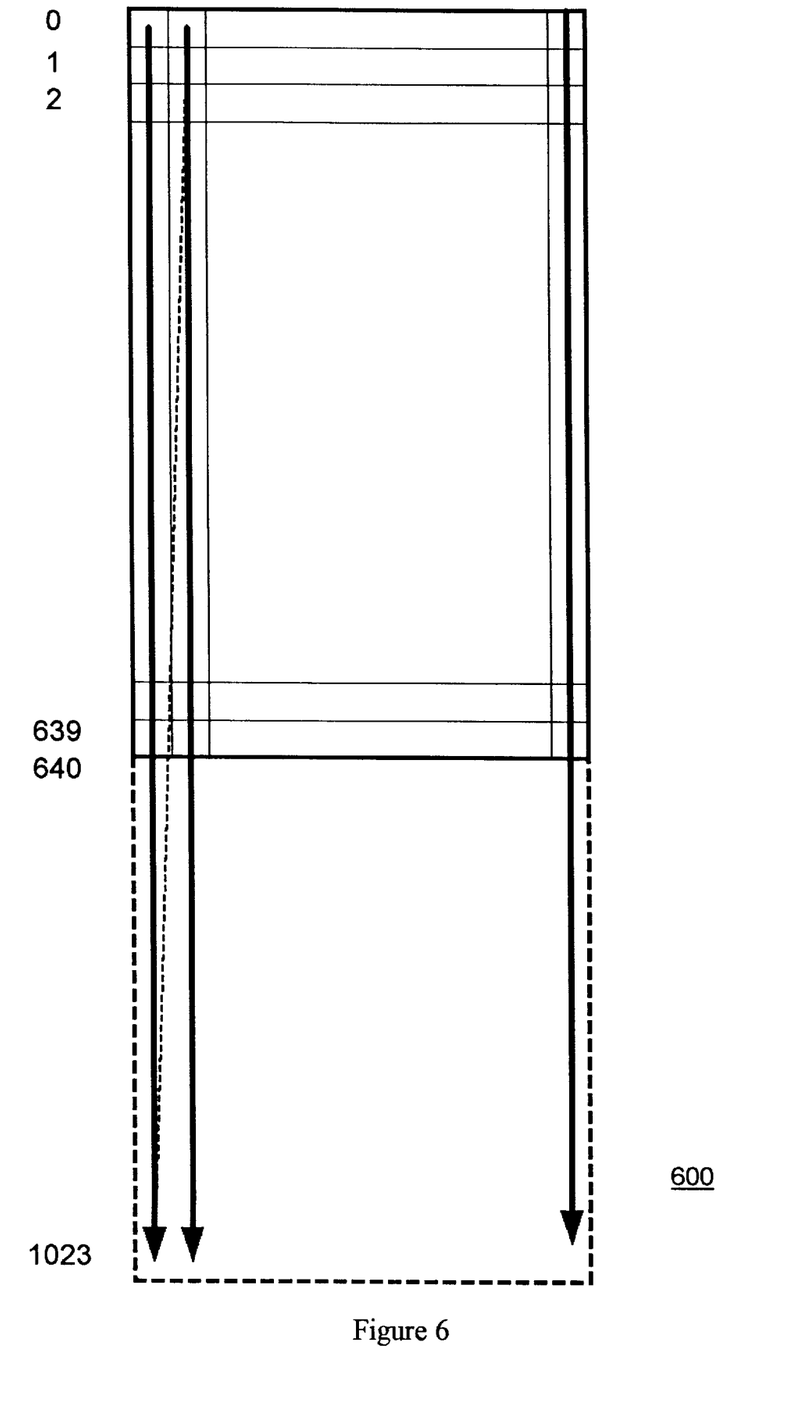
FIG. 6 shows another preferred method of logging out a control store memory according to another aspect of the present invention.

FIG. 6 shows a logging out process of a control store memory according to another aspect of the present invention.

Referring to FIG. 6, the control store memory 600 comprises 640 control store words. That is, the number of control store words is a number less than or equal to 2 to the power n. In the preferred embodiment as shown, the next higher control store address accessible using the same number of address bits is 1023 (i.e. 10 address bits). Since the number of control words addressable by the available address lines (i.e. 1024) is larger than the physically available control store words (i.e. 640), some of the addressable locations (i.e. 640 to 1023) do not have any corresponding physical control store locations. As it will be discussed in the following paragraphs, this aspect of the present invention allows minimal changes in hardware in the control store unit while being able to handle changes in number of control store words in a control store memory.

According to this embodiment of the present invention, the BIST/logout control store addresses are generated by the control store unit as shown in FIG. 3. The sequence of the BIST/logout control store addresses cycles through all the control store memory addresses from the first control store location to the next $2^n-1$ control store location (in the example as shown in FIG. 6: 1023) higher than the physical control address (in the example as shown in FIG. 6: 639). Instead of testing whether the last control store word is reached, the address generator simply generates the control store address sequence beginning from the first control store word until the last control store word addressable by the available control address lines. In this preferred embodiment, the last physical control store word comprises an ending tag indicating the end of the physical control store memory. The tag is continuously compared so that when the last control store word is read from the control store memory, the BIST testing will be terminated.

Furthermore, in the logout function, the control store memory will logout valid data when the control store address is between 0 to 639. Unspecified or invalid data will be logged out from the control store memory when the control store access address is between 640 to 1023. This unspecified or invalid data can be simply ignored by the designer. It should be noted that, in this embodiment, the control store memory should be designed so that no circuitry damage will be incurred to any portion of the control store memory by the illegal physical addresses.

By cycling through all possible control store addresses independent of the control memory physical size, this aspect of the invention eliminates the complexity of the address generation mechanism. In one embodiment, one bit of the control store access address generated can be used as a reset signal to reset the control store address to the first control word. In the preferred embodiment as shown, the sequential addresses generated wrap naturally back to the first control store address (i.e. binary 0) so that no additional logic is needed for ending address detection. In this case, the sequential address generation will be continued even though the control store address generated is higher than the highest available physical control store address. This aspect of the present invention provides tremendous flexibility to the control store designer by allowing them to change the physical size of the control store memory without modifying the circuit designs. In the present invention, the physical size of the control store memory can be increased/decreased by simply placing the ending tag in the last physical control store word. Thus, the physical size of the control store memory can remain flexible during the initial design stage of the microprocessor. After the actual size of the physical control store memory is determined, the ending tag of the last control store word is then set accordingly.

It should be noted that the present invention is not limited to the above-mentioned control store address generation scheme. In another embodiment of the present invention, the sequence of the control store addresses is generated to cover all physical control store locations only. For example, according to this embodiment, the control store addresses are generated to cover only from the first location (i.e. 0) to the last physical control store location (i.e. 639) in the control store memory as shown in FIG. 6. In this embodiment, a test circuit is needed to determine whether the last control store location (i.e. 639) is hit. When the last control store location is hit, the control store address will be reinitialized to the first control store location for the next cycle of the logout process. Because of the immediately resetting the control store access address when the last control store word is reached, this logout method guarantees no wait state between each cycle of the logout process. The disadvantage of this method is the additional testing mechanism and the reset logic needed to determine the last control store address is met.

Figure 7:
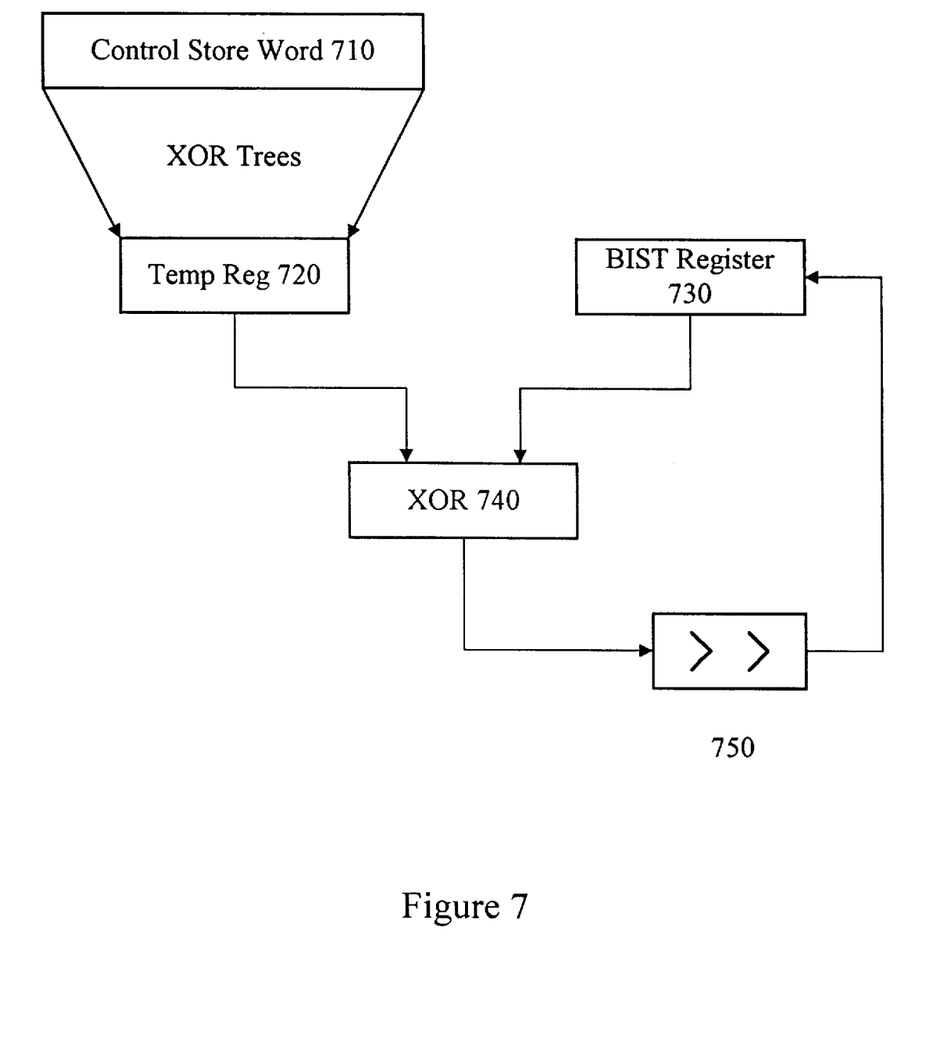
FIG. 7 shows one preferred method of performing the BIST/logout on the control store memory according to the present invention.

FIG. 7 shows one preferred method of performing the BIST testing on the control store memory according to the present invention.

In the present example as shown, each of the control store word output 710 from the control store memory comprises 136 bits of data. According to this BIST testing method, the output control store word 710 is grouped into 17 groups. Each group consists of 8 bits of data. Specifically, group 1 contains bits 0, 17,34 . . . 119 of the control store word 710. Group 2 contains bits 1, 18, 35 . . . 120 of the control store word, similarly. Each group of databits is then pass through an Exclusive OR ("XOR") tree to generate a one-bit sum of the 8 bits of data. Thus, a 17-bit sum of each control store word is generated and stored in a temp register 720.

After every data bit of the temp register 720 is computed, the temp register 720 is then XORed bit-by-bit with a BIST register 730. It should be noted that, according to this embodiment, all bits of the BIST register 730 are initialized to zeros before the first control store word is BIST tested. The XORed result of the temp register 720 and the BIST register 730 is then righted shifted by a shifter 750 and stored in the BIST register 730 replacing the current value.

After the BIST register 730 is updated with the new value, the above-mentioned steps will be repeated for the next control store word. When all the control store words are processed, the final value stored in the BIST register 730 is called as the final BIST signature and will be compared with a predetermined pattern to determine the validity of all the control store data. When the final value stored in the BIST register equals to the predetermined pattern, a BIST result signal is generated by the BIST mechanism to signal the correctness of the control store memory. In the preferred embodiment according to the present invention, the BIST mechanism also provides a BIST valid signal to indicate the BIST result signal is valid so that the BIST result signal is only valid when the BIST valid signal is true. On the other hand, when the BIST valid signal is not true, the BIST result signal is undefined. In the preferred embodiment, the predetermined pattern is stored in the last word of the control store memory.

In this preferred embodiment, the last physical control store word can be determined by monitoring the ending tag as discussed in the previous paragraph. When the ending tag is determined to be set, the above-mentioned BIST testing function will be terminated and the BIST valid/invalid signal will be generated. In some designs, the predetermined pattern is stored in the last control store word. Thus, in these designs, the last control store word is not BIST tested as described.

It should be noted that, the above-mentioned BIST testing mechanism ensures that all typical failure modes of the control store memory can be detected. For example, column, row, block, bit, and total failures of the control store memory can be easily detected. In addition, all single bit failures and most double bit failures can also be detected.

It is to be understood that while the invention has been described above in conjunction with preferred specific embodiments, the description and examples are intended to illustrate and not limit the scope of the invention, which is defined by the scope of the appended claims.

What is claimed is:

1. A control store for storing control signals which control operation of a microprocessor, comprising:
   a control store memory comprising a plurality of storage locations, each storage location storing at least one control store word, and each storage location having a corresponding control store address;
   an address generator coupling to said control store memory for generating a steam of control store access addresses for accessing said control store memory, wherein said control store memory provides a stream of output control store data retrieved from the storage locations addressed by said control store access addresses; and
   a test enable signal source coupled to said control store memory and said address generator for activating a test mode of the control store memory, wherein when said test mode is activated, said stream of control store access addresses comprises a plurality of sequential control store addresses beginning from a starting address.

2. The control store according to claim 1, wherein when said test mode is activated, said stream of control store access addresses increments to the control store address of the last storage location of said control store memory.

3. The control store according to claim 1, wherein when said test mode is not activated, said stream of control store access addresses generated by said address generator comprising direct addresses, sequential addresses, and jump addresses.

4. The control store according to claim 3, wherein said address generator comprises an address incrementor, said sequential addresses are generated by said address incrementor.

5. The control store according to claim 4, wherein said sequential control store test addresses are generated by said address incrementor.

6. The control store according to claim 5, said address generator further comprises a direct address provider and a sequential address provider, wherein when said test mode is deactivated, said sequential addresses are provided to the control store memory through said sequential address provider, when said test enable signal is enabled, said sequential control store test addresses are provided to the control store memory through said direct address provider.

7. The control store according to claim 5, said address generator further comprises a direct address provider and a sequential address provider, wherein when said test mode is deactivated, said sequential addresses are provided to the control store memory through said sequential address provider, when said test mode is activated, said sequential control store test addresses are provided to the control store memory through said sequential address provider.

8. The control store according to claim 3, wherein when said test mode is deactivated, said stream of control store access addresses is generated by said address generator in response to the output control store words provided by the control store memory.

9. The control store according to claim 1, wherein said test enable signal represents beginning of a BIST process.

10. The control store according to claim 1, wherein said test enable signal represents the beginning of a logout process.

11. The control store according to claim 10, wherein said BIST process and said logout process are preformed simultaneously.

12. The control store according to claim 1, wherein said test enable signal represents beginning of a logout process.

13. The control store according to claim 1 further comprising a BIST mechanism, wherein said BIST mechanism performs a plurality of XOR steps to generate a final BIST signature.

14. The control store according to claim 13, wherein said final BIST signature is compared with a predetermined pattern to generate a BIST result signal.

15. A control store for storing control signals which control the operation of a microprocessor, comprising:
 a control store memory comprising a plurality of storage locations, each storage location storing at least one control store word, said control store memory providing an output control store word in response to an input control store address;
 a test enable signal source coupled to the control store memory for activating a control store memory test mode;
 a direct address provider for providing a direct address, wherein said direct address is generated in response to an input address;
 a sequential address provider for providing a next address of the input control store address, said sequential address provider comprising an address incrementor for incrementing said input control store address;
 a jump address provider for providing a jump address, wherein said jump address is generated from the output control store word;
 an address selector coupling to said direct address provider, said sequential address provider, and said jump address provider, said address selector generating the input control store address selected from the direct address, the sequential address, and the jump address, wherein when the control store memory is in the control store memory test mode, said address selector selects said input control store address provided to the control store memory from said address incrementor, and wherein when the control store memory is not in the control store memory test mode, said address selector selects the input control store address in response to the output control store word.

16. The control store according to claim 15, wherein when the control store memory is in the control store memory test mode, said next input control store address is provided from said address incrementor through said direct address provider.

17. The control store according to claim 15, wherein when the control store memory is in the control store memory test mode, said next input control store address is provided from said address incrementor through said sequential address provider.

18. The control store according to claim 15, wherein when the control store memory is not in the control store memory test mode, said address selector selects said direct address from said direct address provider as said input control store address when said direct address is requested.

19. The control store according to claim 15, wherein when the control store memory is not in the control store memory test mode, said address selector selects said next address from said sequential address provider as said input control store address if said next address is requested.

20. The control store according to claim 15, wherein when the control store memory is not in the control store memory test mode, said address selector selects said next address from said jump address provider as said input control store address if the output control word represents either a jump instruction or a return instruction.

21. The control store according to claim 15 further comprising a BIST mechanism, wherein said BIST mechanism performs a plurality of XOR steps to generate a final BIST signature.

22. The control store according to claim 15, wherein said final BIST signature is compared with a predetermined pattern to generate a BIST result signal.

23. A control store for storing control signals in a microprocessor, comprising:
 a control store memory comprising a plurality of storage locations, each storage location storing at least one control store word, and each storage location having a corresponding control store address;
 a test enable signal source coupled to the control store memory for activating a control store memory test mode; and
 an address generator coupling to said control store memory for generating a stream of control store access addresses for accessing the control store memory, wherein said control store memory provides a corresponding stream of output control store data retrieved from the storage locations addressed by the control store access addresses, said address generator comprising:
 an address incrementor for producing a first sequence of consecutive control store access addresses when sequential addresses are requested from the control store, and for producing a second sequence of consecutive control store access addresses when the control store memory test mode is activated.

24. The control store according to claim 23, wherein said address generator comprises a sequential address provider and a direct address provider, said address incrementor being used for generating sequential addresses for said sequential address provider.

25. The control store according to claim 24, wherein said first sequence of consecutive control store access address is provided to said control store memory through said sequential address provider, and wherein said second sequence of consecutive control store access address is provided to said control store memory through said direct address provider.

26. The control store according to claim 24, wherein said first and second sequence of consecutive control store access addresses are provided to said control store memory through said sequential address provider.

27. The control store according to claim 24, wherein said first sequence of consecutive control store access address is fed back to said address incrementor for address incrementation through said sequential address provider, and wherein said second sequence of consecutive control store access address is fed to said address incrementor for address incrementation through said direct address provider.

28. The control store according to claim 24, wherein said first and second sequence of consecutive control store access addresses are fed to said address incrementor for address incrementation through said sequential address provider.

29. The control store according to claim 23 further comprising a BIST mechanism, wherein said BIST mechanism performs a plurality of XOR steps to generate a final BIST signature.

30. The control store according to claim 29, wherein said final BIST signature is compared with a predetermined pattern to generate a BIST result signal.

31. A method of verifying a control store memory, wherein said control store memory comprises a plurality of storage locations, each storage location storing at least one control store word, each of the storage locations corresponds to a valid control store address, wherein all of the valid control store addresses form a valid control store address range, comprising the steps of:

generating a sequence of sequential control store addresses beginning at a first control store address and incrementing to an ending control store address, wherein said sequential control store addresses generated cover a generated control store address range, said generated control store address range is a superset of said valid control store address range, wherein said ending control store address equals $2^N-1$, where N is a predetermined positive integer;

BIST testing at least one control store word corresponding to each of the sequential control store addresses generated when said control store address generated is within said valid control store address range; and logging out at least one bit of the at least one control store word corresponding to each of the sequential control store addresses generated when said control store address generated is within said valid control store address range.

32. The method according to claim 31, said BIST testing is terminated when said control store address generated is outside said valid control store address range.

33. The method according to claim 32, wherein the last control store memory location of said control store memory comprises an ending tag for indicating the position of the last control store memory location.

34. The method according to claim 31, wherein the last control store memory location comprises a predetermined BIST signature.

35. The method according to claim 31, wherein said logging out step produces invalid data when said control store address generated is not within said valid control store address range.

* * * * *